United States Patent
Shang et al.

(10) Patent No.: US 10,235,919 B2
(45) Date of Patent: Mar. 19, 2019

(54) GOA SIGNAL DETERMINING CIRCUIT, DETERMINING METHOD, GATE DRIVER CIRCUIT AND DISPLAY DEVICE

(71) Applicant: BOE TECHNOLOGY GROUP CO., LTD., Beijing (CN)

(72) Inventors: Guangliang Shang, Beijing (CN); Xing Yao, Beijing (CN); Mingfu Han, Beijing (CN); Seung-Woo Han, Beijing (CN); Yun-Sik Im, Beijing (CN); Jing Lv, Beijing (CN); Yinglong Huang, Beijing (CN); Jung-Mok Jun, Beijing (CN); Xue Dong, Beijing (CN); Haoliang Zheng, Beijing (CN); Lijun Yuan, Beijing (CN); Zhichong Wang, Beijing (CN); Ji Ha Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/577,402

(22) PCT Filed: May 3, 2017

(86) PCT No.: PCT/CN2017/082892
§ 371 (c)(1),
(2) Date: Nov. 28, 2017

(87) PCT Pub. No.: WO2017/219763
PCT Pub. Date: Dec. 28, 2017

(65) Prior Publication Data
US 2019/0027079 A1  Jan. 24, 2019

(30) Foreign Application Priority Data
Jun. 23, 2016  (CN) .......................... 2016 1 0465796

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0408* (2013.01); *G09G 2300/0426* (2013.01); *G09G 2310/08* (2013.01)

(58) Field of Classification Search
CPC .... G09G 3/20; G09G 3/36; G09G 2310/0286; G11C 19/00; G11C 19/287
See application file for complete search history.

(56) References Cited

U.S. PATENT DOCUMENTS 8,604,846 B2  12/2013  Cheng et al.
8,964,932 B2  2/2015  Wu et al.
(Continued)

FOREIGN PATENT DOCUMENTS

CN  102184699 A  9/2011
CN  102682689 A  9/2012
(Continued)

OTHER PUBLICATIONS

International Search Report and Written Opinion for Chinese International Application No. PCT/CN2017/082892 dated Jun. 28, 2017.
(Continued)

*Primary Examiner* — Sardis F Azongha
(74) *Attorney, Agent, or Firm* — Calfee, Halter & Griswold LLP (57) ABSTRACT

A GOA signal determining circuit and method thereof, gate driver circuit, and display device are provided. The GOA signal determining circuit is connected to an input end of a GOA unit, at least two clock signal ends of the GOA unit, and a control end of a reset unit of a PU node in the GOA unit. The GOA signal determining circuit detects a signal of (Continued)

the input end of the GOA unit and a signal of the at least two clock signal ends of the GOA unit, and outputs a control signal to the reset unit of the PU node to control the reset unit to output a reset signal to the PU node to turn off an output transistor of the GOA unit, upon determining both of the signal of the input end and the signal of the at least two clock signal ends are abnormal.

14 Claims, 8 Drawing Sheets

(56) References Cited

U.S. PATENT DOCUMENTS

| | | | |
|---|---|---|---|
| 9,425,611 | B2 | 8/2016 | Zhang et al. |
| 2011/0018845 | A1 | 1/2011 | Mizunaga et al. |
| 2012/0169386 | A1 | 7/2012 | Cheng et al. |
| 2014/0064438 | A1 | 3/2014 | Wu et al. |
| 2014/0177780 | A1* | 6/2014 | Qi .................. G09G 3/20 377/64 |
| 2015/0009599 | A1 | 1/2015 | Zhang et al. |
| 2016/0372031 | A1 | 12/2016 | Li |
| 2017/0010731 | A1* | 1/2017 | Zhang .................. G11C 19/28 |
| 2017/0032750 | A1* | 2/2017 | Shao .................. G09G 3/3648 |
| 2017/0178582 | A1* | 6/2017 | Li .................. G09G 3/3607 |

FOREIGN PATENT DOCUMENTS

| | | |
|---|---|---|
| CN | 102831861 A | 12/2012 |
| CN | 103247276 A | 8/2013 |
| CN | 104505042 A | 4/2015 |
| CN | 104575396 A | 4/2015 |
| CN | 105096876 A | 11/2015 |
| CN | 105703745 A | 6/2016 |
| CN | 105913822 A | 8/2016 |
| EP | 2991069 A1 | 3/2016 |
| JP | 2001092417 A | 4/2001 |
| KR | 10-20050120870 | 12/2005 |

OTHER PUBLICATIONS

First Office Action for Chinese Patent Application No. 201610465796.7 dated Dec. 4, 2017.

* cited by examiner

GOA SIGNAL DETERMINING CIRCUIT, DETERMINING METHOD, GATE DRIVER CIRCUIT AND DISPLAY DEVICE

The present invention claims the benefits of Chinese patent application No. 201610465796.7 titled "GOA SIGNAL DETERMINING CIRCUIT, DETERMINING METHOD, GATE DRIVER CIRCUIT AND DISPLAY DEVICE", which was filed with the SIPO on Jun. 23, 2016 and is fully incorporated herein by reference as part of this application.

TECHNICAL FIELD

Embodiments of the present disclosure relate to the technical field of display technology, and particularly to a GOA signal determining circuit, a determining method, a gate driver circuit and a display device.

BACKGROUND

In recent years, liquid crystal display (LCD) device has been developed towards high level of integration and low cost. One of very important technologies is the realization of mass production of gate driver on array (GOA) technology. By integrating gate-on/gate-off circuits on array substrates of LCD panels using the GOA technology, integrated circuits of gate drivers may be omitted so as to reduce the product cost in terms of both materials and manufacturing process. Such gate-on/gate-off circuit integrated on the array substrate by utilizing the GOA technology is also referred to as GOA circuit or shifting register circuit.

The shifting register circuit includes several shifting register units (or GOA units) each corresponding to one gate line. In particular, each of the shifting register units is connected to one gate line. Moreover, an output end of one shifting register unit is connected to an input end of a next shift register unit. Each of the GOA units is driven by several GOA input signals and outputs a driving signal (scanning signal) to the gate line connected thereto. In the related art, the GOA input signal may be lost abnormally during a starting period of the system, which may result in an abnormal condition where an ordinary GOA circuit generates multiple outputs. In order to avoid multiple outputs of GOA under abnormal driving sequence, generally, a reset device is additionally disposed to reset a PU node. The reset device outputs a reset signal to the PU node under a control of a STV signal (frame start signal) received by a Tot-RST end or under a control of a signal of the Tot-RST end. However, the STV signal (frame start signal) generated by using a timer control register (TCON) is just a single pulse appeared at the beginning of a single frame period, and the signal of the Tot-RST end is merely a single pulse appeared at the end of the single frame period. As a result, if a partial loss is occurred in a clock signal of the GOA during a single frame period, abnormal output of the GOA cannot be avoided.

SUMMARY

The embodiments of the present disclosure provide a GOA signal determining circuit and a determining method, a gate driver circuit, and a display device, which can avoid an occurrence of abnormal GOA output caused by a partial loss of GOA input signal during a single frame period.

According to a first aspect, it provides a GOA signal determining circuit which is connected to an input end of a GOA unit, at least two clock signal ends of the GOA unit and a control end of a reset unit of a PU node of the GOA unit. The GOA signal determining circuit is configured to detect a signal of the input end of the GOA unit and a signal of the at least two clock signal ends of the GOA unit; and output a control signal to the reset unit of the PU node, so as to control the reset unit to output a reset signal to the PU node to turn off an output transistor of the GOA unit, upon determining both of the signal of the input end of the GOA unit and the signal of the at least two clock signal ends of the GOA unit involve an anomaly. The at least two clock signal ends of the GOA unit includes at least one pair of clock signal ends having input signals complemented with each other. The PU node of the GOA unit is connected to a gate of the output transistor of the GOA unit; and a drain of the output transistor is connected to an output end of the GOA unit to output a driving signal to a gate line connected to the output end of the GOA unit.

In an example of the embodiment, the GOA signal determining circuit includes a NOR gate; each of the input end of the GOA unit and the at least two clock signal ends of the GOA unit is connected to one of input ends of the NOR gate; and an output end of the NOR gate is connected to the control end of the reset unit.

In an example of the embodiment, the output end of the NOR gate is connected to the control end of the reset unit through a signal amplifier.

In an example of the embodiment, the GOA signal determining circuit is further connected to a first level end and a second level end; the GOA signal determining circuit includes a pull-up unit and a pull-down unit; the pull-up unit is connected to the first level end and the control end of the reset unit, and is configured to output a signal of the first level end to the control end of the reset unit under a control of the signal of the first level end; each of the pull-down units is connected to the input end of the GOA unit or one of the at least two clock signal ends of the GOA unit; the pull-down unit is further connected to the second level end and the control end of the reset unit; the pull-down unit is configured to output a signal of the second level end to the control end of the reset unit under a control of the signal of the second level end, or output the signal of the second level end to the control end of the reset unit under a control of the signal of the clock signal end.

In an example of the embodiment, the pull-up unit includes a first transistor; a gate and a source of the first transistor are connected to the first level end; and a drain of the first transistor is connected to the control end of the reset unit. The pull-down unit includes a second transistor; a gate of the second transistor is connected to the input end of the GOA unit or the clock signal end; a source of the second transistor is connected to the drain of the first transistor; and a drain of the second transistor is connected to the second level end.

In an example of the embodiment, the GOA signal determining circuit is further connected to a first level end, a second level end and a third level end. The GOA signal determining circuit includes a first pull-up unit, a second pull-up unit and at least two pull-down units. The first pull-up unit is connected to the first level end and the control end of the reset unit, and is configured to output a signal of the first level end to the control end of the reset unit under a control of the signal of the first level end during a first stage; the second pull-up unit is connected to the third level end and the control end of the reset unit, and is configured to output a signal of the third level end to the control end of the reset unit under a control of the signal of the third level end during a second stage. Each of the pull-down units is connected to the input end of the GOA unit or one of the at least two clock signal ends of the GOA unit; the pull-down unit is further connected to the second level end and the control end of the reset unit; the pull-down unit is configured to output a signal of the second level end to the control end of the reset unit under a control of the signal of the input end of the GOA unit, or output the signal of the second level end to the control end of the reset unit under a control of the signal of the clock signal end.

In an example of the embodiment, the first pull-up unit includes a first transistor; a gate and a source of the first transistor are connected to the first level end; and a drain of the first transistor is connected to the control end of the reset unit. The second pull-up unit includes a third transistor; a gate and a source of the third transistor are connected to the third level end; and a drain of the third transistor is connected to the drain of the first transistor. The pull-down unit includes a second transistor; a gate of the second transistor is connected to the input end of the GOA unit or the clock signal end; a source of the second transistor is connected to the drain of the first transistor; and a drain of the second transistor is connected to the second level end.

In an example of the embodiment, the GOA signal determining circuit further includes a capacitor; a first electrode of the capacitor is connected to the control end of the reset unit, and a second electrode of the capacitor is connected to the second level end.

According to a second aspect, it provides a gate driver circuit including a plurality of GOA units connected in series, and any one of the abovementioned GOA signal determining units.

According to a third aspect, it provides a display device including the abovementioned gate driver circuit.

According to a fourth aspect, it provides a method of determining GOA driving signal loss, including: detecting a signal of an input end of a GOA unit and a signal of at least two clock signal ends of the GOA unit, and outputting a control signal to a reset unit of a PU node in the GOA unit so as to control the reset unit to output a reset signal to the PU node to turn off an output transistor of the GOA unit, upon determining both of the signal of the input end of the GOA unit and the signal of the at least two clock signal ends of the GOA unit involve an anomaly. The at least two clock signal ends include at least one pair of clock signal ends having input signals complemented with each other; the PU node of the GOA unit is connected to a gate of the output transistor; a drain of the output transistor is connected to an output end of the GOA unit, and is configured to output a driving signal to a gate line connected to the output end of the GOA unit.

Technical solutions of some certain embodiments of the present disclosure enable simultaneously detecting the signal of the input end of the GOA unit and the signal of the at least two clock signal ends of the GOA unit, and enable outputting a control signal to the reset unit of the PU node of the GOA unit so as to control the reset unit to output a reset signal to the PU node to turn off the output transistor of the GOA unit, upon determining both of the signal of the input end of the GOA unit and the signal of the at least two clock signal ends of the GOA unit involve an anomaly; as a result, the PU node can be reset timely through the reset signal so as to turn off the output transistor of the GOA unit, in case that a partial loss of GOA input signal is occurred during a single frame period, thereby preventing from abnormal GOA output.

BRIEF DESCRIPTION OF THE DRAWINGS

Hereinafter the drawings necessary for the description of the embodiments or the prior art will be briefly introduced for the purpose of more clearly explaining the technical solutions of the embodiments of the present disclosure or the prior art. Obviously, the drawings described as below are merely some embodiments of the present disclosure, and are not intended to limit the present disclosure in any way.

DETAILED DESCRIPTION

Hereinafter, the technical solutions of the embodiments of the present disclosure will be described completely and thoroughly in conjunction with the drawings thereof. Obviously, the embodiments described herein merely illustrate a part of implementations of the present disclosure and are not intended to limit the present disclosure in any way. All other possible embodiments conceivable by those skilled in the art without any creative labors, based on those set forth herein, shall be considered as falling within the scope of protection of the present disclosure.

The transistor utilized in all the embodiments of the present disclosure may be a thin film transistor or a field effect transistor, or other elements with similar property. According the role playing in the circuit, the transistor adopted in the embodiments of the present disclosure, usually, is a switching transistor. The source and the drain of the switching transistor adopted herein are symmetrically arranged, and hence are exchangeable. In the embodiments of the present disclosure, for distinguishing one of two electrodes in the transistor other than the gate from the other, the source is referred to as a first end while the drain is referred to as a second end. Depending on the shapes and forms illustrated in the drawings, a middle end of the transistor is defined as the gate, a signal input end is defined as the source, and a signal output end is defined as the drain.

In addition, the switching transistor as adopted in the embodiments of the present disclosure may include P-type and N-type switching transistors.

Figure 1:
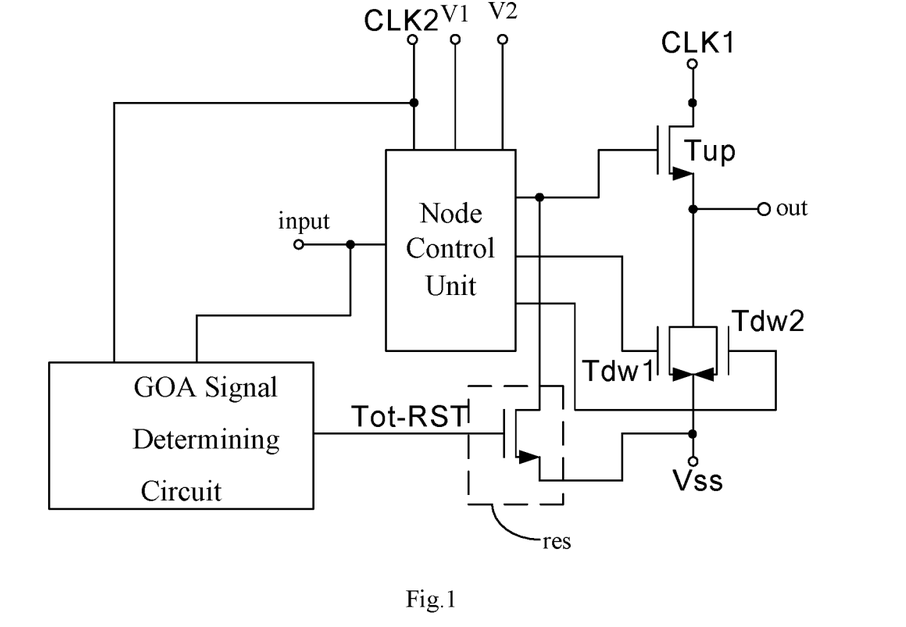
FIG. 1 is a structural schematic view of a GOA signal determining circuit provided by an embodiment of the present disclosure.

Referring to FIG. 1, the embodiments of the present disclosure provide a GOA signal determining circuit, which is connected to an input end 'input' of a GOA unit, at least two clock signal ends CLKs (CLK1 and CLK2) of the GOA unit, and a control end Tot-RST of a reset unit 'res' of a PU node of the GOA unit. The GOA signal determining circuit is configured to detect a signal of the input end 'input' of the GOA unit and a signal of the at least two clock signal ends CLKs (CLK1 and CLK2) of the GOA unit, and output a control signal to the reset unit 'res' of the PU node so as to control the reset unit 'res' to output a reset signal to the PU node to turn off an output transistor Tup of the GOA unit, upon determining both of the signal of the input end 'input' of the GOA unit and the signal of the at least two clock signal ends CLKs (CLK1 and CLK2) of the GOA unit involve an anomaly.

Among the at least two clock signal ends, there is at least one pair of clock signal ends having input signals complemented with each other. The PU node of the GOA unit is connected to a gate of the output transistor Tup of the GOA unit; a drain of the output transistor Tup is connected to an output end 'out' of the GOA unit, and is configured to output a driving signal to a gate line connected to the output end 'out' of the GOA unit.

As illustrated in FIG. 1, it further provides a GOA unit, including: two clock single ends CLK1, CLK2; two level ends V1, V2; one node control unit; and two pull-down transistors Tdw1, Tdw2. The node control unit is connected to nodes PD1, PD2; a gate of the Tdw1 is connected to the node PD1; a gate of the Tdw2 is connected to the node PD2; a source of the Tdw1 is connected to 'out'; a source of the Tdw2 is connected to 'out'; and a drain of Tdw1 and a drain of Tdw2 are connected to a low level end Vss. The GOA unit as illustrated in FIG. 1 is merely one of the examples, and it should be appreciated that any GOA unit including an input end 'input', at least two clock signal ends CLK1, CLK2 having complemented signals and a PU node may be applied to the GOA signal determining circuit of the present disclosure. The input signals of the clock signal ends CLK1 and CLK2 are complemented with each other, which means that the input signals are opposite in phase. Since the CLK signal of a GOA unit driven by a single CLK usually has a certain duty cycle, i.e., the CLK is constituted with alternated high levels and low levels, by way of example, the GOA signal determining circuit provided by the present disclosure cannot normally judge a GOA driving signal loss if the CLK signal is blanking under low level, because the low level is also a sort of normal time sequence. Therefore the embodiments of the present disclosure are applicable for the GOA unit including at least two clock signal ends CLK1 and CLK2 having input signals complemented with each other, because only in this case the signals of CLK1 and CLK2 would be blanking simultaneously due to anomaly. In addition, it should be appreciated that the abovementioned reset unit 'res' may contain only one transistor, of which the gate serves as the control end of the reset unit 'res', the source is connected to the abovementioned PU node, and the drain is connected to a low level. When the transistor is turned on under a control of the control signal, the low level provides a reset signal to the PU node so as to turn off the output transistor Tup of the GOA unit.

In addition, it should be explained that, in a typical application, a pulse of the output signal of the GOA unit and a pulse of the driving clock signal CLK are corresponding to each other in every row; as a result, all the GOA circuits in the gate driver circuit may share a same GOA signal determining circuit in which the input signal is a STV signal (frame start signal), and the reset units 'res' of all the GOA units are connected to the control end Tot-RST of a same module for determining GOA driving signal loss.

The technical solution enables simultaneously detecting the signal of the input end of the GOA unit and the signal of the at least two clock signal ends of the GOA unit, and enable outputting a control signal to the reset unit of the PU node of the GOA unit so as to control the reset unit to output a reset signal to the PU node to turn off the output transistor of the GOA unit, upon determining both of the signal of the input end of the GOA unit and the signal of the at least two clock signal ends of the GOA unit involve an anomaly. As a result, the PU node can be reset timely through the reset signal so as to turn off the output transistor of the GOA unit, in case that a partial loss of GOA input signal is occurred during a single frame period, and thereby avoid abnormal GOA output.

The following examples are described with reference to the case where the GOA unit includes four clock signal ends (CLK1, CLK2, CLK3 and CLK4) by way of example, in which signals of CLK1 and CLK3 are complemented with each other, and signals of CKL2 and CLK4 are complemented with each other.

Figure 2:
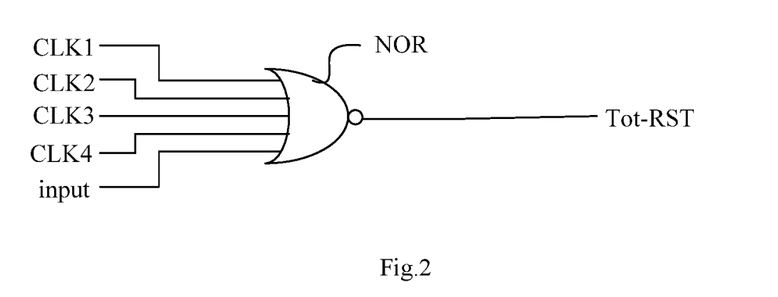
FIG. 2 is a structural schematic view of a GOA signal determining circuit provided by another embodiment of the present disclosure.

Illustratively, referring to FIG. 2, the embodiment of the present disclosure provides a GOA signal determining circuit as below.

The GOA signal determining circuit includes a NOR gate 'NOR'.

Each of the input end 'input' and the at least two clock signal ends (CLK1, CLK2, CLK3 and CLK4) of the GOA unit is connected to one of input ends of the NOR gate 'NOR'.

An output end of the NOR gate 'NOR' is connected to the control end Tot-RST of the reset unit 'res'.

Figure 3:
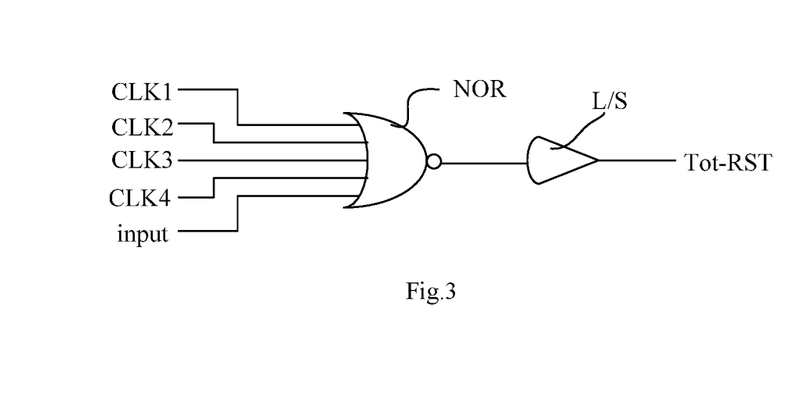
FIG. 3 is a structural schematic view of a GOA signal determining circuit provided by sill another embodiment of the present disclosure.

Further, as illustrated in FIG. 3, in order to prevent the signal of the input end 'input' of the GOA unit and the signal of the at least two clock signal ends (CLK1, CLK2, CLK3 and CLK4) from attenuating upon passing through the NOR gate 'NOR' and resulting in abnormal control of the reset unit 'res', the output end of the NOR gate 'NOR' is connected to the control end Tot-RST of the reset unit 'res' through a signal amplifier L/S.

Figure 4:
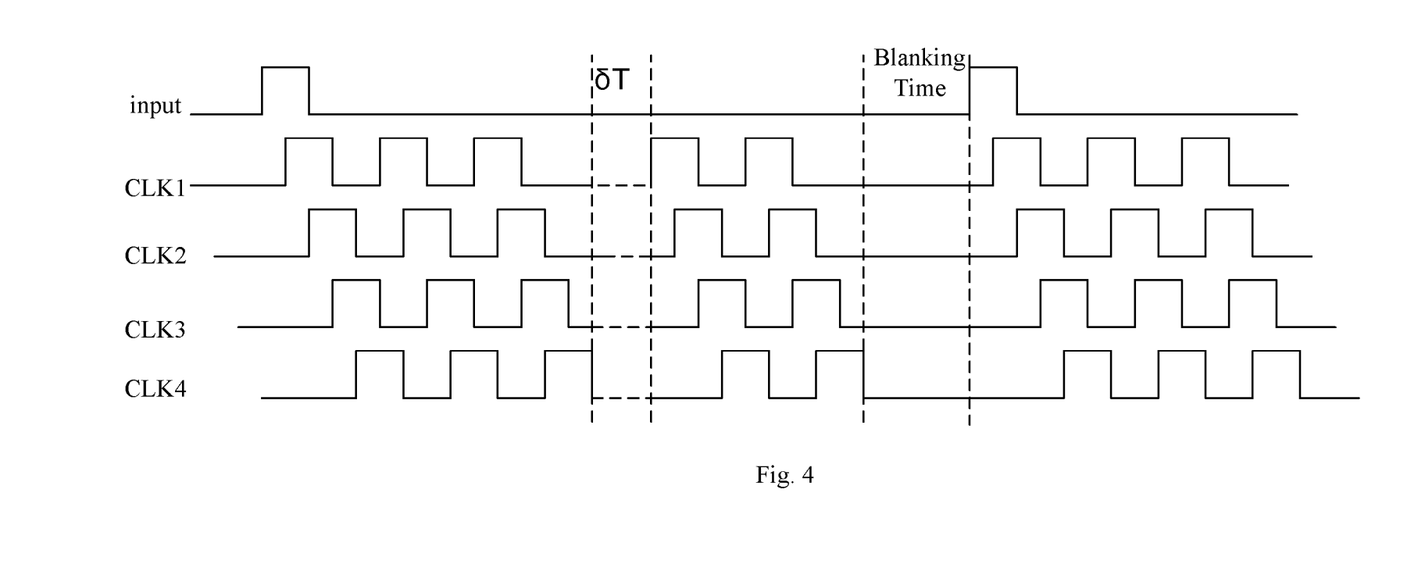
FIG. 4 is a sequence diagram illustrating a drive timing status of a GOA unit provided by an embodiment of the present disclosure.

Referring to the sequence diagram in FIG. 4 by way of example, during a time period δT in which the signal of the input end 'input' of the GOA unit and the signal of the at least two clock signal ends (CLK1, CLK2, CLK3 and CLK4) are blanking abnormally (i.e., all the signals are low level), the NOR gate 'NOR' generates a control signal (high level) by performing a NOR calculation to the signal of the input end 'input' of the GOA unit and the signal of the at least two clock signal ends (CLK1, CLK2, CLK3 and CLK4) of the GOA unit, and outputs the control signal to the next stage; the control signal is then amplified by the signal amplifier L/S and outputted to the PU node to turn off the output transistor Tup of the GOA unit, thereby avoiding an abnormal output of the GOA unit.

Figure 5:
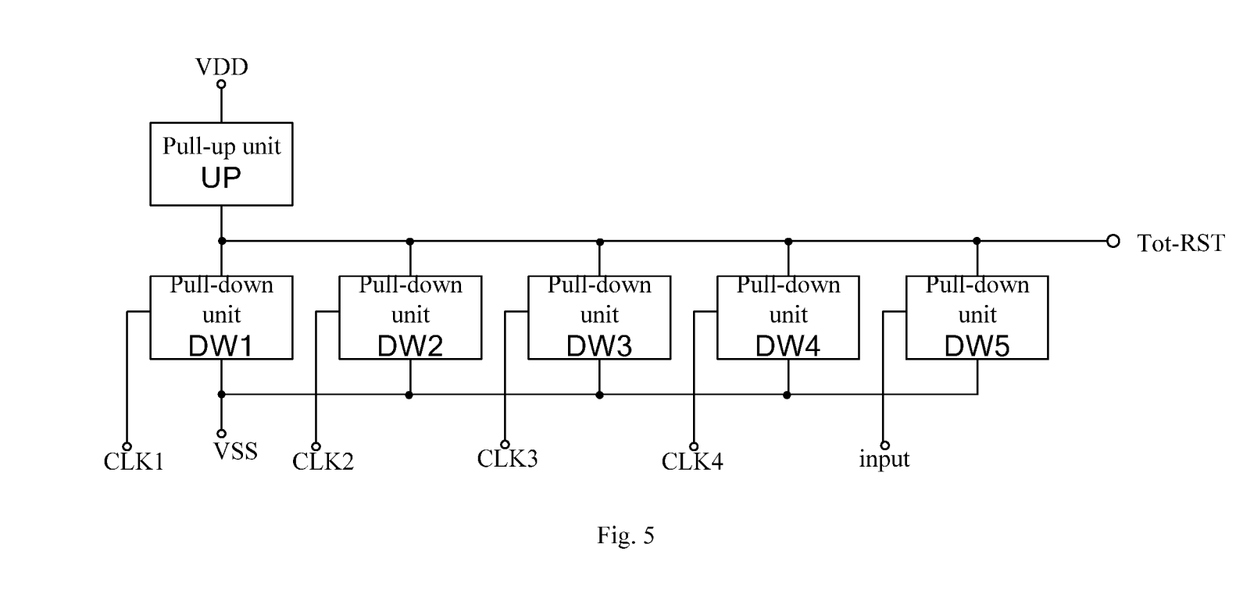
FIG. 5 is a structural schematic view of a GOA signal determining circuit provided by another embodiment of the present disclosure.

By way of example, as illustrated in FIG. 5, the embodiment of the present disclosure provides a GOA signal determining circuit which is further connected to a first level end VDD and a second level end VSS. The GOA signal determining circuit includes a pull-up unit UP and at least two pull-down units DW (the figure illustrates five pull-down units DW1, DW2, DW3, DW4 and DW5). The number of the pull-down unit DW is corresponding to the number of the input end of the GOA unit and the number of the at least two clock signal ends of the GOA unit.

The pull-up unit UP is connected to the first level end VDD and the control end Tot-RST of the reset unit 'res', and is configured to output a signal of the first level end VDD to the control end Tot-RST of the reset unit 'res' under a control of the signal of the first level end VDD.

Each of the pull-down units DWs is connected to the input end 'input' of the GOA unit or one of the at least two clock signal ends CLKs of the GOA unit. The pull-down unit DW is further connected to the second level end VSS and the control end Tot-RST of the reset unit 'res'. The pull-down unit DW is configured to output a signal of the second level end VSS to the control end Tot-RST of the reset unit 'res' under a control of the signal of the input end 'input' of the GOA unit, or output the signal of the second level end VSS to the control end Tot-RST of the reset unit 'res' under a control of the signal of the clock signal end CLK.

By way of example, the pull-up unit UP includes a first transistor T1; a gate and a source of the first transistor T1 are connected to the first level end VDD; and a drain of the first transistor T1 is connected to the control end Tot-RST of the reset unit 'res'.

The pull-down unit DW includes a second transistor T2; a gate of the second transistor T2 is connected to the input end 'input' of the GOA unit or the clock signal end CLK; a source of the second transistor T2 is connected to the drain of the first transistor T1; and a drain of the second transistor T2 is connected to the second level end VDD.

Figure 6:
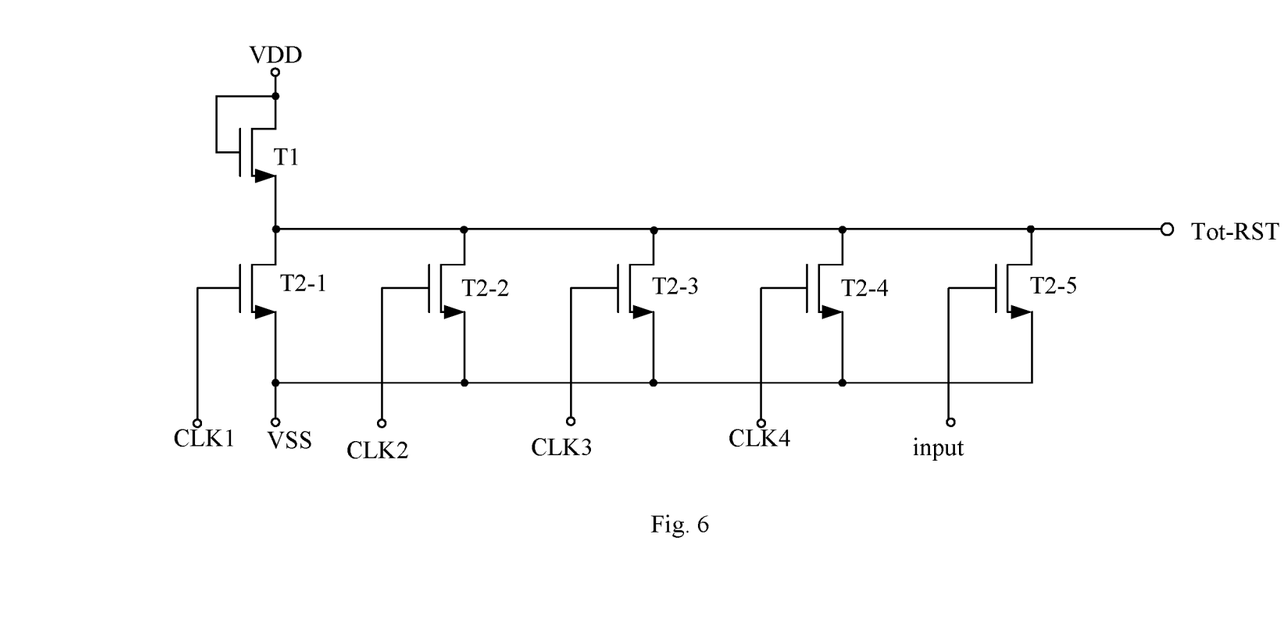
FIG. 6 is a structural schematic view of a GOA signal determining circuit provided by further another embodiment of the present disclosure.

Referring to FIG. 6 which illustrates a structure of the GOA signal determining circuit in FIG. 5, including a pull-up unit UP as well as pull-down units DW1, DW2, DW3, DW4 and DW5. The pull-up unit UP includes the first transistor T1, and each of the pull-down units includes a transistor. As illustrated in the figure, DW1 includes T2-1, DW2 includes T2-2, DW3 includes T2-3, DW4 includes T2-4, and DW5 includes T2-5; CLK1 is connected to a gate of T2-1; CLK2 is connected to a gate of T2-2; CLK3 is connected to a gate of T2-3; CLK4 is connected to a gate of T2-4; and the input end 'input' is connected to a gate of T2-5. According to the GOA signal determining circuit illustrated in FIG. 5 and meanwhile referring to the sequence diagram in FIG. 3, during a time period δ T in which the signal of the input end 'input' of the GOA unit and the signal of the at least two clock signal ends (CLK1, CLK2, CLK3 and CLK4) are blanking abnormally (i.e., all the signals are low level), T2-1, T2-2, T2-3, T2-4 and T2-5 are all in an OFF state (i.e., cutoff state) and T1 is in an ON state to transmit the signal of VDD to Tot-RST, so that the transistor of the reset unit 'res' is turned on and outputs a low level to the PU node so as to turn off the output transistor Tup of the GOA unit, thereby avoiding an abnormal output of the GOA unit.

Figure 7:
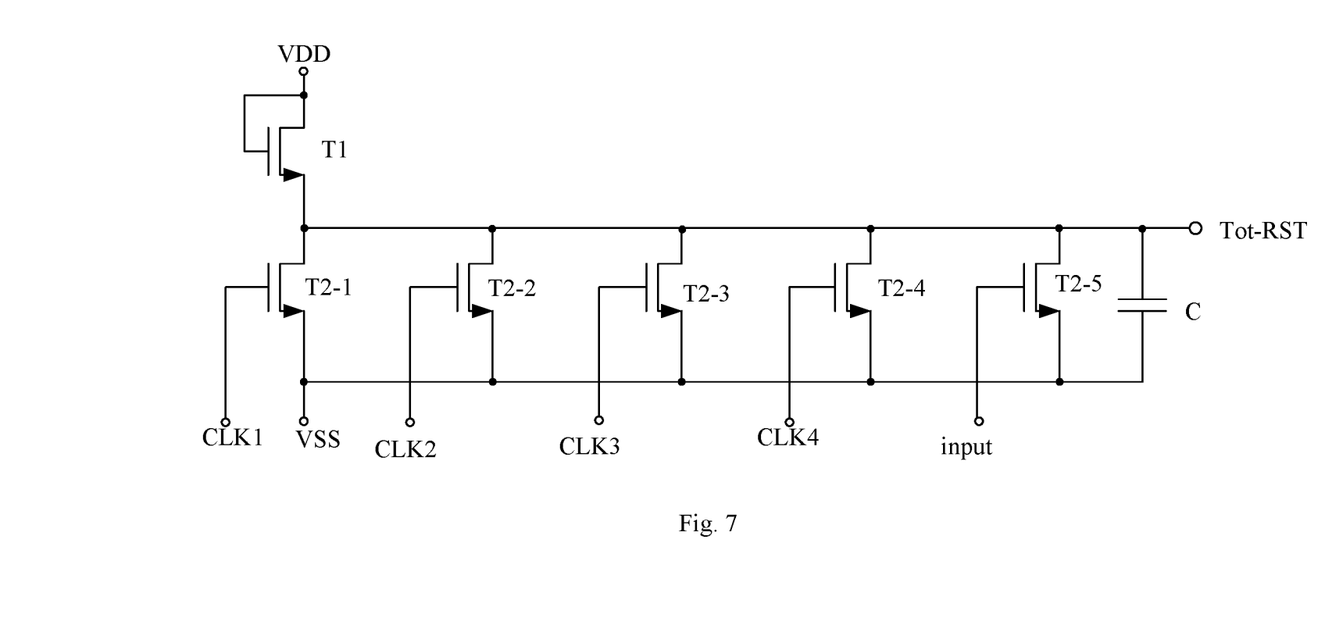
FIG. 7 is a structural schematic view of a GOA signal determining circuit provided by yet another embodiment of the present disclosure.

Further, referring to FIG. 7, the GOA signal determining circuit further includes a capacitor C having a first electrode connected to the control end Tot-RST of the reset unit 'res' and a second electrode connected to the second level end VSS. When the duty cycle of the CLK under normal driving mode cannot satisfy the condition where not all of the CLKs are low level at the same time (by way of example, using two clock signals with opposite phases as the driving signals of the GOAs, and each of the GOAs has a duty cycle smaller than 50%), as illustrated in the blanking time of FIG. 4, the control end Tot-RST may be added with a voltage stability capacitor. The capacitor is capable of storing and maintaining a level at the control end Tot-RST, and hence a relatively shorter time duration in which all the CLKs are low level can be eliminated by filtering to avoid an abnormal reset of the GOA unit when a discharging time of the capacitor is longer than a time period in which all the CKLs are low level under normal driving mode.

Figure 8:
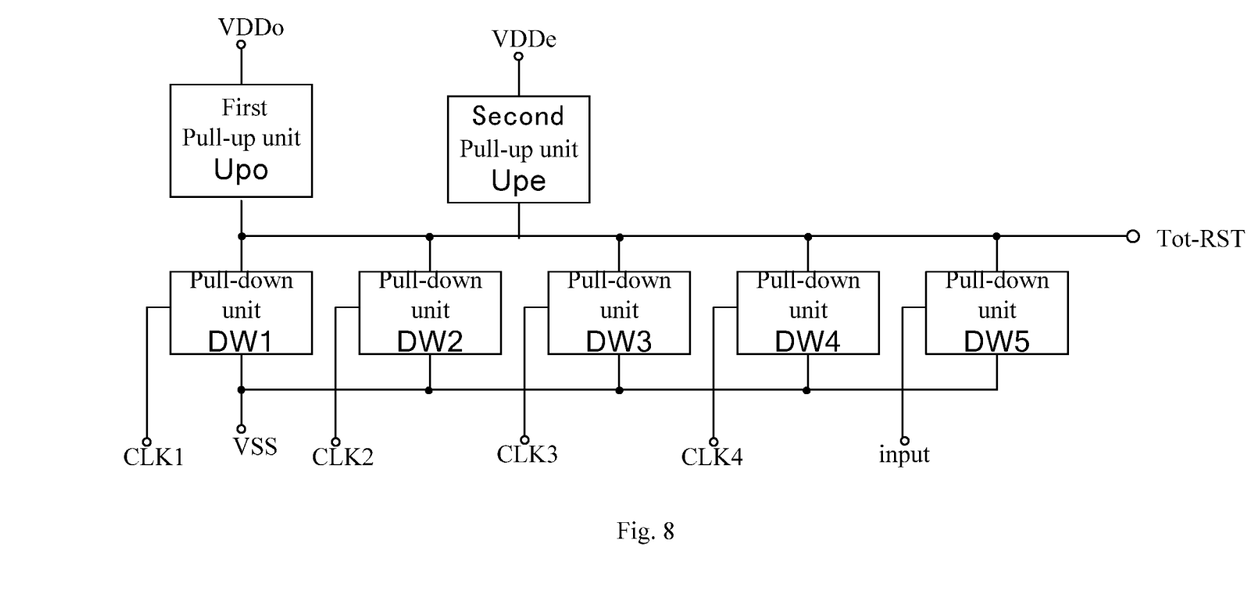
FIG. 8 is a structural schematic view of a GOA signal determining circuit provided by still another embodiment of the present disclosure.

By way of example, as illustrated in FIG. 8, the embodiment of the present disclosure provides a GOA signal determining circuit which is further connected to a first level end VDDo, a second level end VSS and a third level end VDDe.

The GOA signal determining circuit includes a first pull-up unit Upo, a second pull-up unit Upe and at least two pull-down units DWs (the figure illustrates five pull-down units DW1, DW2, DW3, DW4 and DW 5).

The first pull-up unit Upo is connected to the first level end VDDo and the control end Tot-RST of the reset unit 'res', and is configured to output a signal of the first level end VDDo to the control end Tot-RST of the reset unit 'res' under a control of the signal of the first level end VDDo during a first stage.

The second pull-up unit Upe is connected to the third level end VDDe and the control end Tot-RST of the reset unit 'res', and is configured to output a signal of the third level end VDDe to the control end Tot-RST of the reset unit 'res' under a control of the signal of the third level end VDDe during a second stage.

Each of the pull-down units DWs is connected to the input end 'input' of the GOA unit or one of the at least two clock signal ends CLKs of the GOA unit; the pull-down unit DW is further connected to the second level end VSS and the control end Tot-RST of the reset unit 'res'; the pull-down unit DW is configured to output a signal of the second level end VSS to the control end Tot-RST of the reset unit 'res' under a control of the signal of the input end 'input' of the GOA unit, or output the signal of the second level end VSS to the control end Tot-RST of the reset unit 'res' under a control of the signal of the clock signal end CLK.

Optionally, the first pull-up unit Upo includes a first transistor T1; a gate and a source of the first transistor T1 are connected to the first level end VDD; and a drain of the first transistor T1 is connected to the control end Tot-RST of the reset unit 'res'.

The second pull-up unit Upe includes a third transistor T3; a gate and a source of the third transistor T3 are connected to the third level end VDDe; and a drain of the third transistor T3 is connected to the drain of the first transistor T1.

The pull-down unit DW includes a second transistor T2; a gate of the second transistor T2 is connected to the input end 'input' of the GOA unit or the clock signal end CLK; a source of the second transistor T2 is connected to the drain of the first transistor T1; and a drain of the second transistor T2 is connected to the second level VDD.

Figure 9:
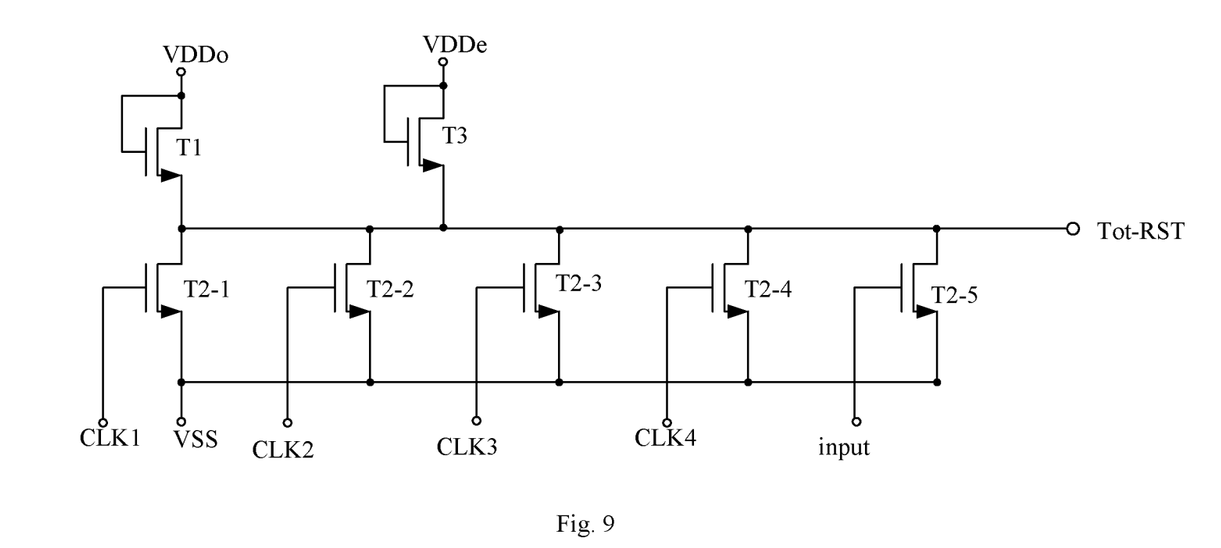
FIG. 9 is a structural schematic view of a GOA signal determining circuit provided by still further another embodiment of the present disclosure.

As illustrated in FIG. 9 which illustrates a specific structure of the GOA signal determining circuit of FIG. 8, including a first pull-up unit Upo, a second pull-up unit Upe, as well as pull-down units DW1, DW2, DW3, DW4 and DW5. Upo includes a transistor T1; Upe includes a transistor T3; each of the pull-down units includes a single transistor. As illustrated in the figure, DW1 includes T2-1; DW2 includes T2-2; DW3 includes T2-3; DW4 includes T2-4; DW5 includes T2-5; CLK1 is connected to a gate of T2-1; CLK2 is connected to a gate of T2-2; CLK3 is connected to a gate of T2-3; CLK4 is connected to a gate of T2-4; and the input end 'input' is connected to a gate of T2-5. According to the GOA signal determining circuit illustrated in FIG. 9 and meanwhile referring to the sequence diagram in FIG. 4, during a time period δ T in which the signal of the input end 'input' of the GOA unit and the signal of the at least two clock signal ends CLKs (CLK1, CLK2, CLK3 and CLK4) are blanking abnormally (i.e., the signals are all low level), T2-1, T2-2, T2-3, T2-4 and T2-5 are all in an OFF state (i.e., cutoff state), and T1 and T3 are alternately in an ON state, during the first stage and the second stage, to transmit the signal of VDDo or the signal of VDDe to the control end Tot-RST, so that the transistor of the reset unit 'res' is turned on to output a low level to the PU node, so as to turn off the transistor Tup of the GOA unit, thereby avoiding an abnormal output of the GOA unit. Moreover, T1 and T3 are alternately in an ON state, which reduces a threshold voltage shift and improves the service life of the circuit.

Figure 10:
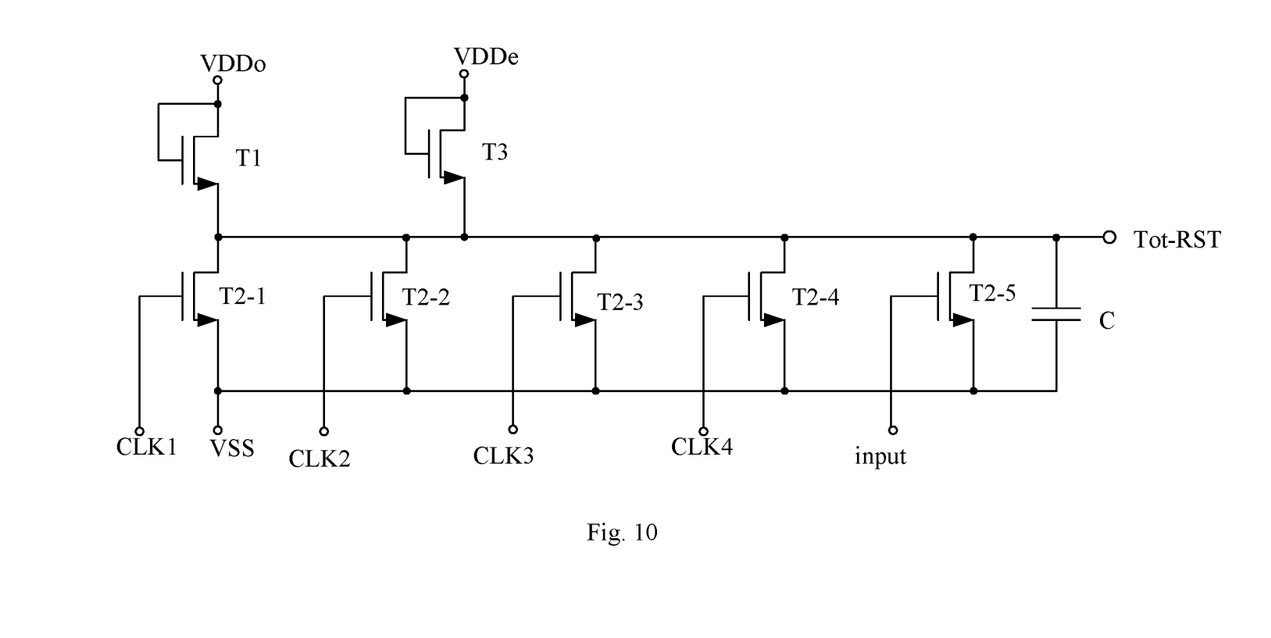
FIG. 10 is a structural schematic view of a GOA signal determining circuit provided by still yet another embodiment of the present disclosure.

Further, referring to FIG. 10, the GOA signal determining circuit further includes a capacitor C having a first electrode connected to the control end Tot-RST of the reset unit 'res' and a second electrode connected to the second level end VSS. When the duty cycle of CLK under normal driving mode cannot satisfy the condition where not all of the CLKs are low level at the same time (by way of example, using two clock signals with opposite phases as the driving signals of the GOAs, and each of the GOAs has a duty cycle smaller than 50%), as illustrated in the blanking time of FIG. 4, the control end Tot-RST may be added with a voltage stability capacitor. The capacitor is capable of storing and maintaining a level at the control end Tot-RST, and hence a relatively shorter time duration in which all the CLKs are low level can be eliminated by filtering to avoid an abnormal reset of the GOA unit when a discharging time of the capacitor is longer than a time period in which all the CKLs are low level under normal driving mode.

The embodiment of the present disclosure provides a gate driver circuit including: a plurality of GOA units connected in series; and the GOA signal determining circuit provided by any of the foregoing embodiments.

The embodiment of the present disclosure further provides a display device including the abovementioned gate driver circuit.

Moreover, the display device may be any product or component having display functions such as digital paper, mobile phone, tablet computer, television, displayer, notebook computer, digital photo frame and navigator.

The embodiment of the present disclosure provides a method of determining a GOA driving signal loss which is applicable for the abovementioned GOA signal determining circuit. The method includes steps as below.

Step S101, detecting a signal of an input end of a GOA unit and a signal of at least two clock signal ends of the GOA unit.

Step S102, outputting a control signal to a reset unit of a PU node in the GOA unit so as to control the reset unit to output a reset signal to the PU node to turn off an output transistor of the GOA unit, upon determining both of the signal of the input end of the GOA unit and the signal of the at least two clock signal ends of the GOA unit involve an anomaly.

The PU node of the GOA unit is connected to a gate of the output transistor of the GOA unit; a drain of the output transistor is connected to an output end of the GOA unit, and is configured to output a driving signal to a gate line connected to the output end of the GOA unit.

The technical solution enables simultaneously detecting the signal of the input end of the GOA unit and the signal of the at least two clock signal ends of the GOA unit, and enable outputting a control signal to the reset unit of the PU node of the GOA unit so as to control the reset unit to output a reset signal to the PU node to turn off the output transistor of the GOA unit, upon determining both of the signal of the input end of the GOA unit and the signal of the at least two clock signal ends of the GOA unit involve an anomaly; as a result, the PU node can be reset timely through the reset signal so as to turn off the output transistor of the GOA unit, in case that a partial loss of GOA input signal is occurred during a single frame period, thereby preventing from abnormal GOA output.

The foregoing are merely illustrative embodiments of the present disclosure without limiting the present disclosure thereto. Those skilled in the art would obviously conceive of various modifications and alternatives without departing from the scope and sprint of the present disclosure, which modifications and alternatives shall also be fallen within the scope of protection of the present disclosure. Therefore the scope of protection of the present disclosure should be defined by the appended claims.

What is claimed is:

1. A GOA signal determining circuit,
  connecting an input end of a GOA unit, at least two clock signal ends of the GOA unit and a control end of a reset unit of a PU node in the GOA unit; wherein the GOA signal determining circuit is configured to detect a signal of the input end of the GOA unit and a signal of the at least two clock signal ends of the GOA unit, and wherein upon determining both of the signal of the input end of the GOA unit and the signal of the at least two clock signal ends of the GOA unit involving an anomaly, the GOA signal determining circuit outputs a control signal to the reset unit of the PU node to control the reset unit to output a reset signal to the PU node to turn off an output transistor of the GOA unit,
  wherein, the at least two clock signal ends comprises at least one pair of clock signal ends having input signals complemented with each other, the PU node of the GOA unit is connected to a gate of the output transistor of the GOA unit, and a drain of the output transistor is connected to an output end of the GOA unit, and is configured to output a driving signal to a gate line connected to the output end of the GOA unit.

2. The GOA signal determining circuit according to claim 1 further comprising a NOR gate, wherein
  the input end of the GOA unit and the at least two clock signal ends of the GOA unit are respectively connected to one of input ends of the NOR gate, and
  an output end of the NOR gate is connected to the control end of the reset unit.

3. The GOA signal determining circuit according to claim 2, wherein the output end of the NOR gate is connected to the control end of the reset unit through a signal amplifier.

4. The GOA signal determining circuit according to claim 1, wherein
  the GOA signal determining circuit is further connected to a first level end and a second level end,
  the GOA signal determining circuit further comprises a pull-up unit and at least two pull-down units;
  wherein the pull-up unit is connected to the first level end and the control end of the reset unit, and is configured to output a signal of the first level end to the control end of the reset unit under a control of the signal of the first level end;
  each of the pull-down units is connected to the input end of the GOA unit or one of the at least two clock signal ends of the GOA unit; the pull-down unit is further connected to the second level end and the control end of the reset unit; the pull-down unit is configured to output a signal of the second level end to the control end of the reset unit under a control of the signal of the second level end, or to output the signal of the second level end to the control end of the reset unit under a control of the signal of the clock signal end.

5. The GOA signal determining circuit according to claim 4, wherein the pull-up unit comprises a first transistor; a gate and a source of the first transistor are connected to the first level end; and a drain of the first transistor is connected to the control end of the reset unit, and the pull-down unit comprises a second transistor; a gate of the second transistor is connected to the input end of the GOA unit or the clock signal end of the GOA unit; a source of the second transistor is connected to the drain of the first transistor; and a drain of the second transistor is connected to the second level end.

6. The GOA signal determining circuit according to claim 5 further comprises a capacitor, wherein a first electrode of the capacitor is connected to the control end of the reset unit, and a second electrode of the capacitor is connected to the second level end.

7. The GOA signal determining circuit according to claim 4 further comprises a capacitor, wherein a first electrode of the capacitor is connected to the control end of the reset unit, and a second electrode of the capacitor is connected to the second level end.

8. The GOA signal determining circuit according to claim 1, wherein the GOA signal determining circuit is further connected to a first level end, a second level end, and a third level end;

the GOA signal determining circuit further comprises a first pull-up unit, a second pull-up unit, and at least two pull-down units;

wherein, the first pull-up unit is connected to the first level end and the control end of the reset unit, and is configured to output a signal of the first level end to the control end of the reset unit under a control of the signal of the first level end during a first stage; and the second pull-up unit is connected to the third level end and the control end of the reset unit, and is configured to output a signal of the third level end to the control end of the reset unit under a control of the signal of the third level end during a second stage, and each of the pull-down units is connected to the input end of the GOA unit or one of the at least two clock signal ends of the GOA unit; the pull-down unit is further connected to the second level end and the control end of the reset unit; the pull-down unit is configured to output a signal of the second level end to the control end of the reset unit under a control of the signal of the input end of the GOA unit, or output the signal of the second level end to the control end of the reset unit under a control of the signal of the clock signal end.

9. The GOA signal determining circuit according to claim 8, wherein the first pull-up unit comprises a first transistor; a gate and a source of the first transistor are connected to the first level end; and a drain of the first transistor is connected to the control end of the reset unit, the second pull-up unit comprises a third transistor; a gate and a source of the third transistor are connected to the third level end; and a drain of the third transistor is connected to the drain of the first transistor, and the pull-down unit comprises a second transistor; a gate of the second transistor is connected to the input end of the GOA unit or the clock signal end of the GOA unit; a source of the second transistor is connected to the drain of the first transistor; and a drain of the second transistor is connected to the second level end.

10. The GOA signal determining circuit according to claim 9 further comprises a capacitor, wherein a first electrode of the capacitor is connected to the control end of the reset unit, and a second electrode of the capacitor is connected to the second level end.

11. The GOA signal determining circuit according to claim 8 further comprises a capacitor, wherein a first electrode of the capacitor is connected to the control end of the reset unit, and a second electrode of the capacitor is connected to the second level end.

12. A gate driver circuit, comprising:

a plurality of GOA units connected in series and the GOA signal determining circuit according to claim 1.

13. A display device, comprising the gate driver circuit according to claim 12.

14. A method of determining a GOA signal, comprising:

connecting a GOA signal determining circuit with an input end of a GOA unit, at least two clock signal ends of the GOA unit and a control end of a reset unit of a PU node in the GOA unit;

detecting a signal of the input end of the GOA unit and a signal of the at least two clock signal ends of the GOA unit, and outputting the control signal to the reset unit of the PU node in the GOA unit so as to control the reset unit to output a reset signal to the PU node to turn off an output transistor of the GOA unit, upon determining both of the signal of the input end of the GOA unit and the signal of the at least two clock signal ends of the GOA unit involving an anomaly, the at least two clock signal ends comprising at least one pair of clock signal ends having input signals complemented with each other; the PU node of the GOA unit being connected to a gate of the output transistor; a drain of the output transistor being connected to an output end of the GOA unit, and being configured to output a driving signal to a gate line connected to the output end of the GOA unit.

* * * * *